(12) United States Patent
Ebara et al.

(10) Patent No.: US 9,761,741 B2
(45) Date of Patent: Sep. 12, 2017

(54) FILM-FORMING MATERIAL

(75) Inventors: Kazuya Ebara, Funabashi (JP); Hikaru Imamura, Funabashi (JP); Rikimaru Sakamoto, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 364 days.

(21) Appl. No.: 13/990,916

(22) PCT Filed: Dec. 1, 2011

(86) PCT No.: PCT/JP2011/077810
§ 371 (c)(1),
(2), (4) Date: Jul. 11, 2013

(87) PCT Pub. No.: WO2012/074058
PCT Pub. Date: Jun. 7, 2012

(65) Prior Publication Data
US 2013/0284262 A1 Oct. 31, 2013

(30) Foreign Application Priority Data
Dec. 2, 2010 (JP) ................. 2010-269501

(51) Int. Cl.
H01L 31/0216 (2014.01)
C08G 12/26 (2006.01)
C08G 18/80 (2006.01)
C08G 18/38 (2006.01)

(52) U.S. Cl.
CPC ........ H01L 31/02168 (2013.01); C08G 12/26 (2013.01); C08G 18/3851 (2013.01); C08G 18/8061 (2013.01); Y02E 10/50 (2013.01); Y02E 10/52 (2013.01)

(58) Field of Classification Search
CPC .............. H01L 31/02168; C08G 12/26; C08G 18/8061; C08G 18/3851; Y02E 10/52; Y02E 10/50
USPC .................................. 524/100, 609
See application file for complete search history.

(56) References Cited

U.S. PATENT DOCUMENTS 5,633,331 A * 5/1997 Nichols ............... C08L 69/00
525/462

FOREIGN PATENT DOCUMENTS

| CN | 101578336 A | 11/2009 | |
|---|---|---|---|
| JP | WO 0020478 A1 * | 4/2000 | ........... C03C 25/106 |
| JP | A-2001-119047 | 4/2001 | |
| JP | A-2001-267597 | 9/2001 | |
| JP | 2007009183 A * | 1/2007 | |
| JP | A-2008-168488 | 7/2008 | |
| JP | A-2010-031232 | 2/2010 | |
| JP | A-2010-135652 | 6/2010 | |
| WO | WO 2007030353 A1 * | 3/2007 | ......... C08G 18/3275 |
| WO | 2008/082264 A1 | 7/2008 | |

OTHER PUBLICATIONS

JP 2007-009183 A (2007), SciFinder abstract.*
Ina et al., "Smoothing of PV System Output by Tuning MPPT Control," *Electrical Engineering in Japan*, vol. 152, No. 2, pp. 10-17, 2005; Translated from *The Journals of the Institute of Electrical Engineers of Japan*, vol. 124-B, No. 3, pp. 455-461, Mar. 2004.
International Search Report issued in Application No. PCT/JP2011/077810; Dated Mar. 13, 2012.
Dec. 31, 2014 Office Action issued in Chinese Application No. 201180066623.3.
Nov. 28, 2016 Office Action issued in Chinese Application No. 201510459653.0.

* cited by examiner

*Primary Examiner* — Josephine Chang
(74) *Attorney, Agent, or Firm* — Oliff PLC

(57) ABSTRACT

There is provided a novel material used for solar cells that can contribute to the improvement in maximum output of solar cells. A film-forming material for forming a light-collecting film on a transparent electrode of a solar cell, including an aromatic group-containing organic polymer compound (A), wherein the film-forming material exhibits an index of refraction of 1.5 to 2.0 at a wavelength of 633 nm and a transmittance of 95% or more with respect to light having a wavelength of 400 nm, and a solar cell obtained by coating a cured film made from the film-forming material on a surface of a transparent electrode.

5 Claims, No Drawings

FILM-FORMING MATERIAL

TECHNICAL FIELD

The present invention relates to a film-forming material used for a solar cell and specifically to a film-forming material coated on a surface of a transparent electrode of a solar cell and used as a light-collecting film.

BACKGROUND ART

In recent years, solar photovoltaic technology has been significantly developed and various solar cells are commercially distributed. The solar photovoltaic power generation of "converts light energy from the sun into electric energy" has such advantages that (1) the energy source is enormous and is not depleted; (2) the energy source is clean and carbon dioxide is not generated during power generation; and (3) it allows energy self-sufficiency, and it is technology that can be used not only outside but also in space. The solar cells are roughly classified into the ones containing a silicon semiconductor (crystalline and amorphous (noncrystalline)) as a material and the ones containing a compound semiconductor as a material and cover more various types including those under development.

However, current solar cells can generate only low electricity despite the high production cost, and result in very low cost effectiveness compared to conventional power generation systems. In addition, solar cells after long-term use are observed to have degradation phenomena such as yellowing, separation, whitening and the like of sealing materials due to sunlight and moisture. Therefore currently the solar cells are required to have a long operating life as well as improved maximum power output.

As one of the currently proposed methods for long operating life of a solar cell, measures for preventing degradation have been confered by adding an ultraviolet absorber, a light stabilizer and an antioxidant to a sealing material.

In order to improve the maximum power output, maximum power point tracking (MPPT) which allows the maximum power output to be obtained by maintaining an optimal operating point according to the variation in the incident light intensity has been widely used (Non-Patent Document 1).

PRIOR ART DOCUMENTS

Patent Documents

Patent Document 1: Japanese Patent Application Publication No. 2010-31232
Patent Document 2: Japanese Patent Application Publication No. 2001-119047
Non-Patent Document 1: Nobuhiko INA, et al., "Smoothing PV System's Output by Tuning a Characteristic Property of MPPT Control", The Journals of the Institute of Electrical Engineers of Japan. B, 124, No. 3, pp. 455-461 (2004)

SUMMARY OF THE INVENTION

Problems to be Solved by the Invention

The MPPT control system described above may be disadvantageous because, when it is introduced into a solar photovoltaic power generation system of a small scale and independent power system such as for household use, the output power variation of the solar photovoltaic power generation system accompanying the variation in the incident light intensity may affect the frequency of the power system. Thus there is a need for other means that can provide improved maximum output without using the MPPT control system.

With the foregoing in view, it is an object of the present invention to provide a novel material used for solar cells that can contribute to the improvement in maximum output of solar cells for example without using the conventional MPPT control system.

Means for Solving the Problems

The present inventors have carried out extensive studies in order to achieve the above object and, as a result, found that a solar cell having an improved maximum output can be produced by forming a cured film having a high index of refraction and high transparency as a light-collecting film on a transparent electrode of a solar cell unit, thereby completed the present invention.

Thus the present invention relates to, as the first aspect thereof, a film forming material for forming a light-collecting film on a transparent electrode of a solar cell, including an aromatic group-containing organic polymer compound (A), wherein the film forming material exhibits an index of refraction of 1.5 to 2.0 at a wavelength of 633 nm and a transmittance of 95% or more with respect to light having a wavelength of 400 nm.

The present invention relates to, as the second aspect thereof, the film-forming material according to the first aspect, wherein the organic polymer compound (A) is a polymer compound having a triazine skeleton or a fluorene skeleton.

The present invention relates to, as the third aspect thereof, the film-forming material according to the second aspect, wherein the organic polymer compound (A) is a polymer compound having a triazine skeleton, the polymer compound being obtained by polymerizing triazine compound having at least two nitrogen atoms substituted with a hydroxymethyl and/or alkoxymethyl group as a monomer, the polymer compound having a weight average molecular weight of at least 5,000, triazine skeletons being linked through a N—$CH_2$—N group or a N—$CH_2$—O—$CH_2$—N group, and the polymer compound having a hydroxymethyl group and/or an alkoxymethyl group and/or an ester moiety at a polymer terminal.

The present invention relates to, as the fourth aspect thereof, the film-forming material according to the third aspect, wherein the triazine compound is selected from a group consisting of a melamine compound and a benzoguanamine compound.

The present invention relates to, as the fifth aspect thereof, the film-forming material according to the fourth aspect, further including as the component (B) a triazine compound having at least two nitrogen atoms substituted with a hydroxymethyl and/or alkoxymethyl group or a urea compound having at least two nitrogen atoms substituted with a hydroxymethyl and/or alkoxymethyl group.

The present invention relates to, as the sixth aspect thereof, the film-forming material according to the fifth aspect, wherein the film-forming material contains the component (B) at 10 to 100 parts by mass relative to 100 parts by mass of the organic polymer compound (A).

The present invention relates to, as the seventh aspect thereof, the film-forming material according to the second aspect, wherein the organic polymer compound (A) is a compound having a fluorene skeleton, having an aromatic cardo structure and having a weight average molecular weight of at least 5,000, and aromatic cardo structures being linked through a structure containing an ether bond and a thioether bond.

The present invention relates to, as the eighth aspect thereof, the film-forming material according to the seventh aspect, wherein the organic polymer compound (A) has at least four benzene rings.

The present invention relates to, as the ninth aspect thereof, the film-forming material according to the eighth aspect, wherein the organic polymer compound (A) has, in addition to the aromatic cardo structure, a structure of the formula (1):

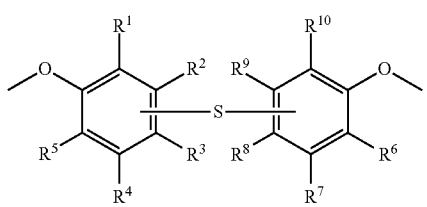
(1)

(where $R^1$ to $R^{10}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, an amino group, a carboxyl group, a phosphonyl group, a sulfonyl group, a phenyl group which is optionally substituted with $W^8$, a naphthyl group which is optionally substituted with $W^8$, a thienyl group which is optionally substituted with $W^8$ or a furyl group which is optionally substituted with $W^8$, provided that one group among $R^1$ to $R^5$ forms the —S— group together with one group among $R^6$ to $R^{10}$; and $W^8$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phosphonyl group or a sulfonyl group).

The present invention relates to, as the tenth aspect thereof, the film-forming material according to the ninth aspect, further including as a component (C) a compound substituted with a blocked isocyanato group.

The present invention relates to, as the eleventh aspect thereof, the film-forming material according to the tenth aspect, wherein the film-forming material contains the component (C) at 10 to 100 parts by mass relative to 100 parts by mass of the organic polymer compound (A).

The present invention relates to, as the twelfth aspect thereof, the film-forming material according to the sixth aspect, further including an adherence agent (D) at less than 10 parts by mass relative to 100 parts by mass of the organic polymer compound (A).

The present invention relates to, as the thirteenth aspect thereof, the film-forming material according to the twelfth aspect, wherein the adherence agent (D) is a compound of the formula (2):

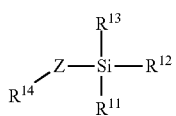
(2)

(where $R^{11}$ to $R^{14}$ are independently a $C_{1-10}$ alkyl group, a $C_{1-10}$ haloalkyl group, a $C_{1-10}$ alkoxy group, a halogen atom, a nitro group, a formyl group, a cyano group, an amino group, a carboxyl group, a phosphonyl group, a sulfonyl group, a hydroxy group, a vinyl group, an allyl group, a thiol group, a glycidyl group, a phenyl group which is optionally substituted with $W^8$, a naphthyl group which is optionally substituted with $W^8$, a thienyl group which is optionally substituted with $W^8$ or a furyl group which is optionally substituted with $W^8$;

$W^8$ is a $C_{1-10}$ alkyl group, a $C_{1-10}$ haloalkyl group, a $C_{1-10}$ alkoxy group, a hydroxy group, a vinyl group, an allyl group, a thiol group, a glycidyl group, a halogen atom, a nitro group, a formyl group, a cyano group, a carboxyl group, a phosphonyl group or a sulfonyl group;

z is a single bond, a $C_{1-10}$ alkylene group which is optionally substituted with $W^9$, —C(O)O—, —C(O)NH—, —O—, —S—, —S(O)$_2$— or —C(O)—; and $W^9$ is a $C_{1-10}$ alkyl group, a $C_{1-10}$ haloalkyl group or a $C_{1-10}$ alkoxy group).

The present invention relates to, as the fourteenth aspect thereof, the film-forming material according to the thirteenth aspect, wherein in the compound of the formula (2), $R^{11}$ to $R^{13}$ are $C_{1-10}$ alkoxy groups and $R^{14}$ is an amino group.

The present invention relates to, as the fifteenth aspect thereof, the film-forming material according to any one of the first to fourteenth aspects, wherein the film-forming material further includes a solvent (E) and is in the form of varnish.

The present invention relates to, as the sixteenth aspect thereof, a solar cell including a cured film obtained with the film-forming material according to any one of the first to fifteenth aspects, with the cured film being coated on a surface of a transparent electrode.

Effects of the Invention

The film-forming material of the present invention can form a cured film which is transparent and has a high index of refraction by simply applying the film-forming material and allowing it to cure on a transparent electrode of a solar cell unit.

The solar cell including the cured film obtained with the film-forming material of the present invention, with the cured film being coated on a surface of a transparent electrode, can improve maximum output power.

MODES FOR CARRYING OUT THE INVENTION

The present invention relates to a material for forming a light-collecting film on a transparent electrode of a solar cell. The film-forming material contains an aromatic group-containing organic polymer compound (A) and exhibits an index of refraction of 1.5 to 2.0 at a wavelength of 633 nm and a transmittance of 95% or more with respect to light having a wavelength of 400 nm.

In the present invention, as the organic polymer compound (A), a polymer compound having a triazine skeleton or a fluorene skeleton is used.

<Organic Polymer Compound (A): Polymer Compound Having a Triazine Skeleton>

The polymer compound having a triazine skeleton, which is used in the present invention, is a polymer compound which is obtained by polymerizing as a monomer a triazine compound having at least two nitrogen atoms substituted with a hydroxymethyl and/or alkoxymethyl group and has a weight average molecular weight of at least 5,000. In this compound, triazine skeletons are linked through a N—CH$_2$—N group or a N—CH$_2$—O—CH$_2$—O—N group and the compound has a hydroxymethyl group and/or an alkoxymethyl group and/or an ester moiety at a polymer terminal.

Examples of the triazine compound having at least two nitrogen atoms which is a constituting monomer of the polymer compound include melamine compounds having nitrogen atoms substituted either with a hydroxymethyl group or an alkoxymethyl group or with both of the foregoings and benzoguanamine compounds having nitrogen atoms substituted either with a hydroxymethyl group or an alkoxymethyl group or with both of the foregoings.

The melamine and benzoguanamine compounds having nitrogen atoms substituted with a hydroxymethyl group can be obtained by, for example, reaction of melamine/benzoguanamine with formalin in boiled water for hydroxymethylation. The melamine and benzoguanamine compounds having nitrogen atoms substituted with an alkoxymethyl group can be obtained by reaction of the hydroxymethyl-substituted melamine/benzoguanamine compounds with an alcohol such as methanol, ethanol, isopropyl alcohol, normal hexanol and the like.

The melamine and benzoguanamine compounds substituted with these hydroxymethyl and/or alkoxymethyl groups are commercially available. Examples of the melamine compound include CYMEL 300, CYMEL 303, CYMEL 325 and CYMEL 725 (all from Nihon Cytec Industries Inc.), NIKALAC MW-30M, NIKALAC MW-30, NIKALAC MW-30HM, NIKALAC MW-390 and NIKALAC MW-100LM (all from Sanwa Chemical Co., Ltd.) (all products are methoxymethylated melamine compounds); CYMEL 370 and CYMEL 701 (all from Nihon Cytec Industries Inc.) (all products are methylated methoxymethylated melamine compounds); CYMEL 266, CYMEL 285 and CYMEL 212 (all from Nihon Cytec Industries Inc.) (all products are methoxymethylated butoxymethylated melamine compounds); CYMEL 272 and CYMEL 202 (all from Nihon Cytec Industries Inc.) (all products are methylated methoxymethylated melamine compounds); CYMEL 238 from Nihon Cytec Industries Inc. (methoxymethylated isobutoxymethylated melamine compound); and MY COAT 506 from Nihon Cytec Industries Inc. (butoxymethylated melamine compound). Examples for the benzoguanamine compound include CYMEL 1123 from Nihon Cytec Industries Inc. (methoxymethylated ethoxymethylated benzoguanamine compound); CYMEL 1123-10 and MY COAT 30 (all from Nihon Cytec Industries Inc.) (all products are methoxymethylated butoxymethylated benzoguanamine compounds); MY COAT 105 and MY COAT 106 (all from Nihon Cytec Industries Inc.) (all products are methoxymethylated benzoguanamine compounds); CYMEL 1128 from Nihon Cytec Industries Inc. (butoxymethylated benzoguanamine compound); and MYCOAT 102 from Nihon Cytec Industries Inc. (methylated methoxymethylated benzoguanamine compound).

The polymer compound having a triazine skeleton can be obtained by condensation reaction of one or two or more types of triazine compounds described above. It is desirably a polymer compound containing a structure derived from a melamine compound and a benzoguanamine compound, which is obtained by condensation reaction of at least one melamine compound described above and at least one benzoguanamine compound described above. Specifically, the polymer compound can be obtained according to the method described in U.S. Pat. No. 6,323,310, for example by thermal condensation of a hexamethoxymethyl melamine compound and a tetramethoxy benzoguanamine compound in an organic solvent.

The organic solvent used for the condensation reaction includes, for example, ethyl butyrate, ethylene glycol methyl ether, ethylene glycol ethyl ether, methyl cellulose acetate, ethyl cellulose acetate, diethylene glycol methyl ether, diethylene glycol ethyl ether, propylene glycol, propylene glycol methyl ether, propylene glycol methyl ether acetate, propylene glycol methyl ether acetate, propylene glycol propyl ether acetate, toluene, xylene, methyl ethyl ketone, cyclopentanone, cyclohexanone, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, ethyl 3-ethoxypropionate, methyl pyruvate, ethyl acetate, butyl acetate and butyl butyrate.

In the above condensation reaction, an acid compound such as p-toluenesulfonic acid, salicylic acid, sulfosalicylic acid, citric acid, benzoic acid, hydroxybenzoic acid, methanesulfonic acid, trifluoroacetic acid, trifluoromethanesulfonic acid and the like is used as a catalyst. When the catalyst is used, the amount thereof is 0.001 to 50 mass % relative to the sum of the triazine compound and the catalyst used. The reaction time and temperature of the condensation reaction is 0.5 to 100 hours and 25 to 200° C. These conditions are appropriately selected according to the type of the triazine compound used, the desired weight average molecular weight of the polymer compound and the like.

The organic polymer compound (A) used for the present invention: Polymer compound having a triazine skeleton has a structure in which triazine skeletons are linked through a —N—CH$_2$—N— group and a —N—CH$_2$—O—CH$_2$—N— group and has a hydroxymethyl group and/or an alkoxymethyl group and/or an ester moiety at a polymer terminal. Thus, for example, the polymer compound obtained by reaction between a hexamethoxymethyl melamine compound and tetramethoxy benzoguanamine has the structure of the following formula.

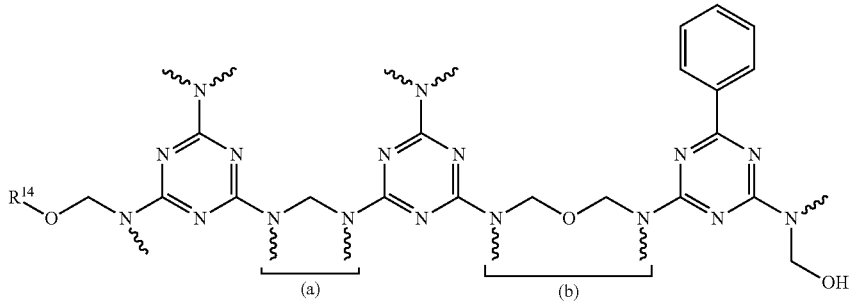

In the above formula, $R^{14}$ is a hydrogen or ether, a hydroxy group or an organic group containing an ester moiety. In the above formula, the part (a) corresponds to a —N—CH$_2$—N— group and the part (b) corresponds to a —N—CH$_2$—O—CH$_2$—N— group; however the parts (a) and (b) can be either of —N—CH$_2$—N— or —N—CH$_2$—O—CH$_2$—N— group.

<Organic Polymer Compound (A): Polymer Compound Having a Fluorene Skeleton>

The polymer compound having a fluorene skeleton used for the present invention is a polymer compound which has an aromatic cardo structure and has a weight average molecular weight of at least 5,000, wherein aromatic cardo structures are linked through an ether bond and a thioether bond.

The aromatic cardo (hinge) structure is represented by 9,9-diarylfluorene and is a structure obtained by attaching various benzene rings to fluorene so as to have a particular conformation in which benzene rings and the fluorene ring intersect at right angles to each other in three different directions.

In the present invention, the polymer compound having a fluorene skeleton preferably has at least four benzene rings.

More preferably, the polymer compound has, in addition to the cardo structure, the structure of the following formula (1), namely has a structure in which cardo structures are linked through a bond containing the structure of the formula (1).

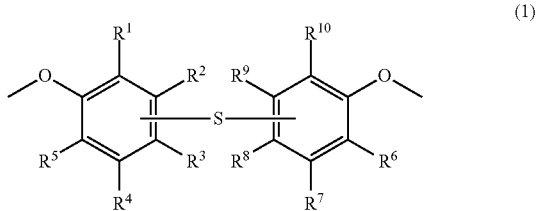

(1)

In the above formula, $R^1$ to $R^{10}$ are independently a hydrogen atom, a C$_{1-10}$ alkyl group, a C$_{1-10}$ haloalkyl group, a alkoxy group, a halogen atom, a nitro group, a formyl group, a cyano group, an amino group, a carboxyl group, a phosphonyl group, a sulfonyl group, a phenyl group which is optionally substituted with W$^8$, a naphthyl group which is optionally substituted with W$^8$, a thienyl group which is optionally substituted with W$^8$ or a furyl group which is optionally substituted with W$^8$, provided that one group among $R^1$ to $R^5$ forms the —S— group together with one group among $R^6$ to $R^{10}$.

W$^8$ is a C$_{1-10}$ alkyl group, a C$_{1-10}$ haloalkyl group, a C$_{1-10}$ alkoxy group, a hydroxy group, a halogen atom, a nitro group, a formyl group, a cyano group, a carboxyl group, a phosphonyl group or a sulfonyl group.

In the present invention, the polymer compound having a fluorene skeleton can be obtained by condensation reaction of at least one compound (monomer) having an aromatic cardo structure and at least one compound (monomer) having the structure of the above formula (1).

Examples of the compound having an aromatic cardo compound and used for this reaction include 9,9-bis(hydroxyaryl)fluorene compounds such as 9,9-bis(4-hydroxyphenyl)fluorene, 9,9-bis(3,5-dimethyl-4-hydroxyphenyl)fluorene and the like.

Examples of the compound having the structure of the formula (1) include
bis(4-(oxiran)-2-ylmethoxy)phenyl)sulfane,
bis(2-butyl-6-methyl-4-(oxiran)-2-ylmethoxy)phenyl)sulfane,
bis(2-isobutyl-6-methyl-4-(oxiran)-2-ylmethoxy)phenyl)sulfane,
bis(2-t-butyl-6-methyl-4-(oxiran)-2-ylmethoxy)phenyl)sulfane,
bis(2-butyl-5-methyl-4-(oxiran)-2-ylmethoxy)phenyl)sulfane,
bis(2-isobutyl-5-methyl-4-(oxiran)-2-ylmethoxy)phenyl)sulfane,
bis(2-t-butyl-5-methyl-4-(oxiran)-2-ylmethoxy)phenyl)sulfane,
bis(2-methyl-4-(oxiran)-2-ylmethoxy)phenyl)sulfane,
bis(2-ethyl-4-(oxiran)-2-ylmethoxy)phenyl)sulfane,
(2-propyl-4-(oxiran)-2-ylmethoxy)phenyl)sulfane,
(2-isopropyl-4-(oxiran)-2-ylmethoxy)phenyl)sulfane,
(2-butyl-4-(oxiran)-2-ylmethoxy)phenyl)sulfane,
(2-isobutyl-4-(oxiran)-2-ylmethoxy)phenyl)sulfane,
(2-t-butyl-4-(oxiran)-2-ylmethoxy)phenyl)sulfane,
bis(2-butyl-6-methyl-3-(oxiran)-2-ylmethoxy)phenyl)sulfane,
bis(2-isobutyl-6-methyl-3-(oxiran)-2-ylmethoxy)phenyl)sulfane,
bis(2-t-butyl-6-methyl-3-(oxiran)-2-ylmethoxy)phenyl)sulfane,
bis(2-butyl-5-methyl-3-(oxiran)-2-ylmethoxy)phenyl)sulfane,
bis(2-isobutyl-5-methyl-3-(oxiran)-2-ylmethoxy)phenyl)sulfane,
bis(2-t-butyl-5-methyl-3-(oxiran)-2-ylmethoxy)phenyl)sulfane,
bis(2-methyl-3-(oxiran)-2-ylmethoxy)phenyl)sulfane,
bis(2-ethyl-3-(oxiran)-2-ylmethoxy)phenyl)sulfane,
(2-propyl-3-(oxiran)-2-ylmethoxy)phenyl)sulfane,
(2-isopropyl-3-(oxiran)-2-ylmethoxy)phenyl)sulfane, (2-butyl-3-(oxiran)-2-ylmethoxy)phenyl)sulfane,
(2-isobutyl-3-(oxiran)-2-ylmethoxy)phenyl)sulfane,
(2-t-butyl-3-(oxiran)-2-ylmethoxy)phenyl)sulfane,
bis(4-(oxirane-2-ylmethoxy)-2,3-diamyl-phenyl)sulfane and the like.

The condensation reaction described above is specifically carried out by heating, for example, 9,9-bis(4-hydroxyphenyl)fluorene and bis(4-(oxiran)-2-ylmethoxy)phenyl)sulfane in an organic solvent in an organic solvent and ring opening of bis(4-(oxiran)-2-ylmethoxy)phenyl)sulfane.

Examples of the organic solvent used for this reaction include the same solvents used for production of the "polymer compound having a triazine skeleton", namely ethyl butyrate, ethylene glycol methyl ether, ethylene glycol ethyl ether, methyl cellulose acetate, ethyl cellulose acetate, diethylene glycol methyl ether, diethylene glycol ethyl ether, propylene glycol, propylene glycol methyl ether, propylene glycol methyl ether acetate, propylene glycol methyl ether acetate, propylene glycol propyl ether acetate, toluene, xylene, methyl ethyl ketone, cyclopentanone, cyclohexanone, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, ethyl 3-ethoxypropionate, methyl pyruvate, ethyl acetate, butyl acetate and butyl butyrate.

This reaction is usually carried out in the presence of a catalyst for which preferred catalysts include, for example, alkali metal hydroxides such as sodium hydroxide, potassium hydroxide, lithium hydroxide and the like; alkali metal alcoholates such as sodium methylate and the like; tertiary amines such as N,N-dimethylbenzylamine, triethylamine, pyridine and the like; quaternary ammonium salts such as tetramethylammonium chloride, benzyltriethylammonium chloride; organic phosphorous compounds such as triphenylphosphine, triethylphosphine and the like; alkali metal salts such as lithium chloride, lithium bromide and the like, Lewis acids such as boron trifluoride, aluminium chloride, tin tetrachloride and the like.

The organic polymer compound (A) used for the present invention: The polymer compound having a triazine skeleton and the polymer compound having a fluorene skeleton have a weight average molecular weight of at least 5,000, preferably 5,000 to 100,000, more preferably 5,000 to 50,000 and particularly 7,000 to 30,000.

<Component (B): Cross-Linker (2)>

When the polymer compound having a triazine skeleton described above is used as the organic polymer compound (A) in the present invention, a component (B) as a cross-linker: A triazine compound having at least two nitrogen atoms substituted with a hydroxymethyl and/or alkoxymethyl group or a urea compound having at least two nitrogen atoms substituted with a hydroxymethyl and/or alkoxymethyl group can be further contained.

Examples of the triazine compound having at least two nitrogen atoms substituted with a hydroxymethyl and/or alkoxymethyl group include those mentioned in the above section <polymer compound having a triazine skeleton> as specific examples of melamine compounds having nitrogen atoms substituted either with a hydroxymethyl group or an alkoxymethyl group or with both of the foregoings and benzoguanamine compounds having nitrogen atoms substituted either with a hydroxymethyl group or an alkoxymethyl group or with both of the foregoings.

Specific examples of the urea compound having at least two nitrogen atoms substituted with a hydroxymethyl and/or alkoxymethyl group include NIKALAC MX-270, NIKALAC MX-280, NIKALAC MX-290 (all from Sanwa Chemical Co., Ltd.) and the like.

The component (B) is used, in view of the strength of the resulting film, 1 to 50 parts by mass, more preferably 1 to 20 parts by mass in view of the storage stability, relative to 100 parts by mass of the organic polymer compound (A).

Component (C): Cross-Linker (2)>

When the polymer compound having a fluorene skeleton described above is used as the organic polymer compound (A) in the present invention, a component (C) as a cross-linker: A compound substituted with a blocked isocyanato group can be further contained. This component can be obtained by reaction of an appropriate blocking agent on a compound having two or more isocyanate groups in one molecule.

Examples of the compound having two or more isocyanate groups in one molecule include isophorone diisocyanate, 1,6-hexamethylene diisocyanate, methylene bis(4-cyclohexylisocyanate), trimethyl hexamethylene diisocyanate and the like or dimers and trimers thereof or reaction products thereof with diols, triols, diamines, triamines and the like.

Examples of the blocking agent include alcohols such as methanol, ethanol, isopropanol, n-butanol, 2-ethoxyhexanol, 2-N,N-dimethylaminoethanol, 2-ethoxyethanol, cyclohexanol and the like; phenols such as phenol, o-nitrophenol, p-chlorophenol, o-, m- or p-cresol and the like; lactams such as ε-caprolactam and the like; oximes such as acetone oxime, methyl ethyl ketone oxime, methyl isobutyl ketone oxime, cyclohexanone oxime, acetophenone oxime, benzophenone oxime and the like; pyrazoles such as pyrazole, 3,5-dimethylpyrazole, 3-methylpyrazole and the like; and thiols such as dodecanethiol, benzenethiol and the like.

Specific examples of the compound of the component (C) include the following. In the following formulae, R is an organic group.

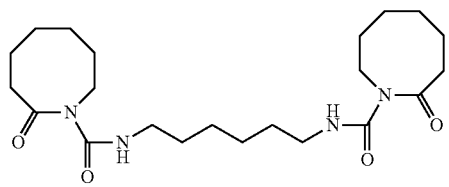

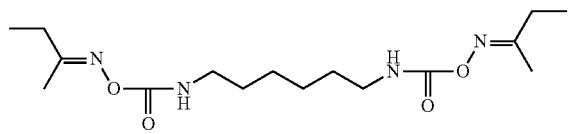

11
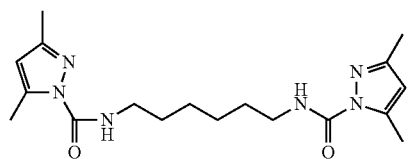
12
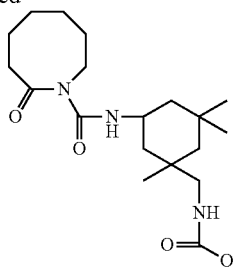 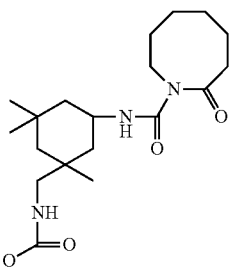
-continued
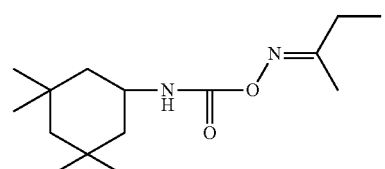
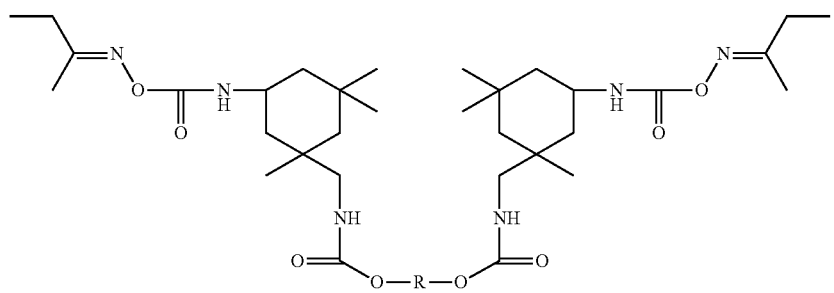
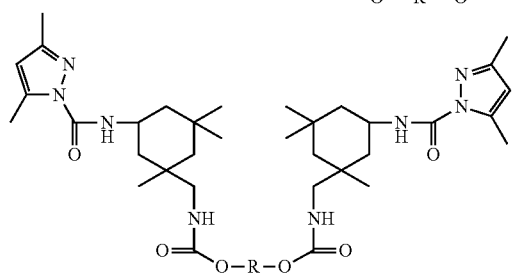 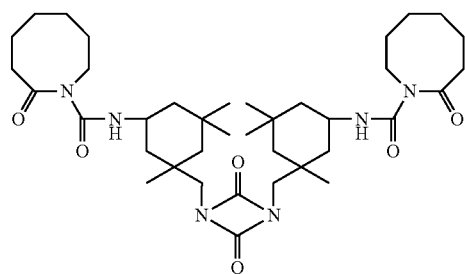
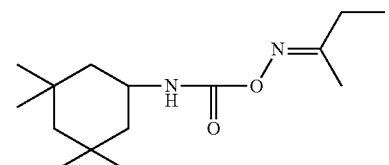
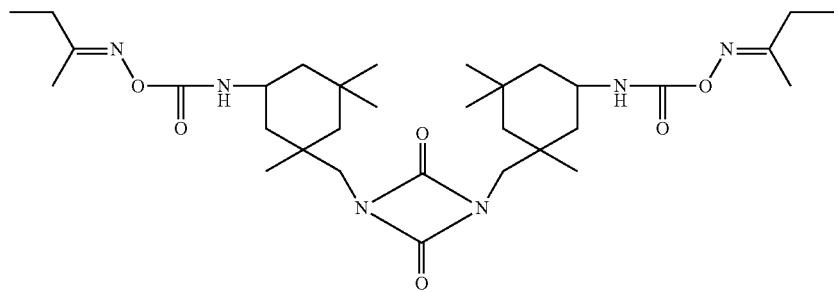
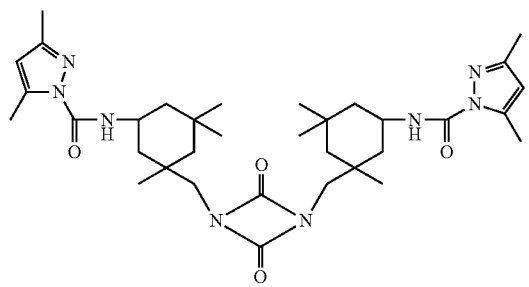 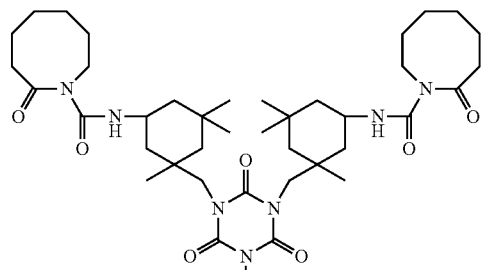
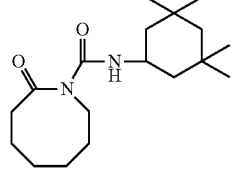

-continued

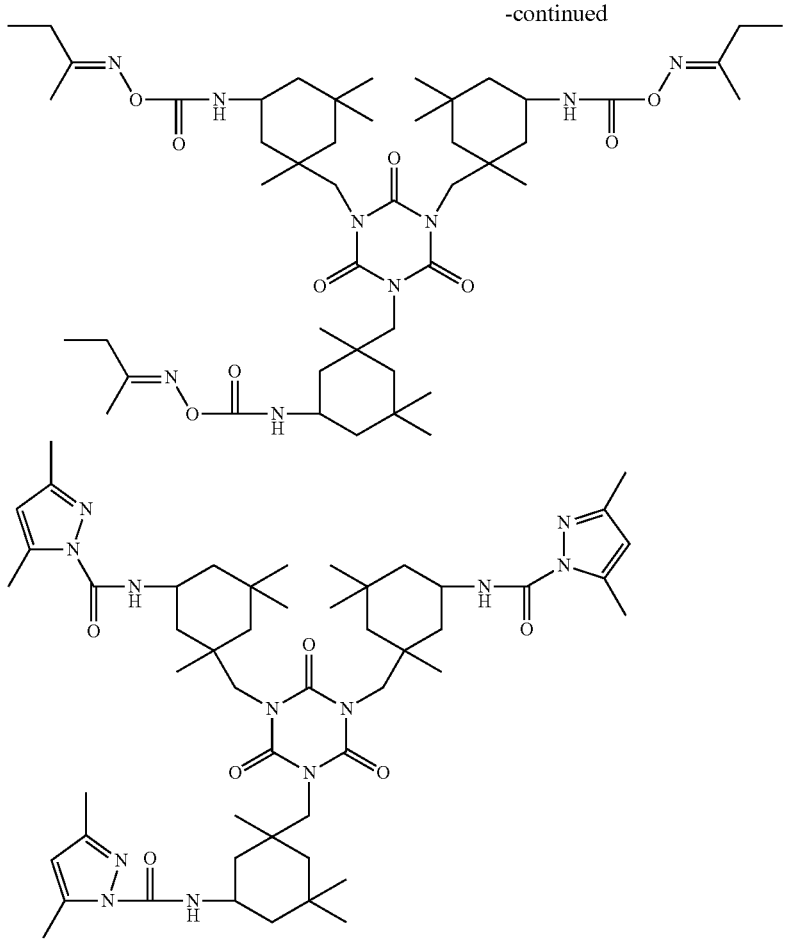

In the present invention, the compound of the component (C) can be used alone or in combination with two or more compounds.

The component (C) is used at 10 to 100 parts by mass, more preferably at 10 to 20 parts by mass relative to 100 parts by mass of the organic polymer compound (A).

<Component (D): Adherence Agent>

In the present invention, in addition to the above components, a component (D) that is an adherence agent is optionally contained.

Examples of the adherence agent which is used herein include vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, N-phenyl-3-aminopropyltrimethoxysilane, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, 3-isocyanatopropyltriethoxysilane, 3-aminopropyldiethoxymethylsilane and the like.

In particular, the adherence agent is preferably the compound of the formula (2).

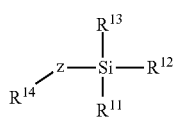

In the above formula, $R^{11}$ to $R^{14}$ are independently a $C_{1-10}$ alkyl group, a $C_{1-10}$ haloalkyl group, a $C_{1-10}$ alkoxy group, a halogen atom, a nitro group, a formyl group, a cyano group, an amino group, a carboxyl group, a phosphoryl group, a sulfonyl group, a hydroxy group, a vinyl group, an allyl group, a thiol group, a glycidyl group, a phenyl group which is optionally substituted with $W^8$, a naphthyl group which is optionally substituted with $W^8$, a thienyl group which is optionally substituted with $W^8$ or a furyl group which is optionally substituted with $W^8$; $W^8$ is a $C_{1-40}$ alkyl group, a $C_{1-10}$ haloalkyl group, a $C_{1-10}$ alkoxy group, a hydroxy group, a vinyl group, an allyl group, a thiol group, a glycidyl group, a halogen atom, a nitro group, a formyl group, a cyano group, a carboxyl group, a phosphonyl group or a sulfonyl group; z is a single bond, a $C_{1-10}$ alkylene group which is optionally substituted with $W^9$, —C(O)O—, —C(O)NH—, —O—, —S—, —S(O)$_2$— or —C(O)—; and W$^9$ is a C$_{1-10}$ alkyl group, a C$_{1-10}$ haloalkyl group or a C$_{1-10}$ alkoxy group.

In the compound of the above formula (2), compounds in which R$^{11}$ to R$^{13}$ are C$_{1-10}$ alkoxy groups and R$^{14}$ is an amino group are preferably used; specifically 3-aminopropyltrimethoxysilane, 3-aminopropyltriethoxysilane, 3-aminopropyldiethoxymethylsilane, N-2-(aminoethyl)-3-aminopropyltriethoxysilane or N-phenyl-3-aminopropyltrimethoxysilane.

In the present invention when the adherence agent is used, the amount thereof is desirably less than 10 parts by mass or desirably 5 parts by mass or less in view of the storage stability, relative to 100 parts by mass of the organic polymer compound (A).

<Other Components>

The film-forming material of the present invention can contain other conventional additives, for example a surfactant and the like.

Examples of the surfactant include nonionic surfactants including polyoxyethylene alkyl ethers such as polyoxyethylene lauryl ether, polyoxyethylene stearyl ether, polyoxyethylene cetyl ether, polyoxyethylene oleyl ether and the like; polyoxyethylene alkyl allyl ethers such as polyoxyethylene octyl phenol ether, polyoxyethylene nonyl phenol ether and the like; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate and the like; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate and the like; fluorine surfactants including EFTOP EF301, EF303 and EF352 (all from JEMCO Inc. (former Tohkem Products Corporation)), MEGAFAC F171, F173 and R-30 (all from DIC Corporation (former Dainippon Ink & Chemicals Inc.)), FLUORAD FC430 and FC431 (all from Sumitomo 3M Limited); ASAHI GUARD AG710, SURFLON S-382, SC101, SC102, SC103, SC104, SC105 and SC106 (all from Asahi Glass Co., Ltd.); an organosiloxane polymer KP341 (Shin-Etsu Chemical Co., Ltd.) and the like.

The amount of these surfactants is, among all components of the film-forming material of the present invention, usually 0.2 mass % or less, preferably 0.1 mass % or less. These surfactants can be used alone or in combination with two or more surfactants.

<Component (E): Solvent>

The film-forming material of the present invention is optionally in the form of varnish by adding a solvent for solubilization.

The solvent which can be used includes, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methyl-2-pyrrolidone, γ-butyrolactone and the like. These solvents can be used alone or in combination with two or more solvents.

The film-forming material of the present invention contains solid matters of for example 0.5 to 50 mass %, 1 to 30 mass % or 1 to 25 mass %. The term "solid matters" herein refers to all components in the film-forming material except for the solvent component.

<Solar Cell>

The film-forming material of the present invention is applicable as a material of various silicon solar cells which have been conventionally proposed.

A solar cell generally includes a solar cell unit having a transparent electrode (surface electrode)/a photoelectric conversion layer/a back electrode; a panel material for mounting the solar cell unit, namely a sealing material for sealing the cell module such as an ethylene-vinyl acetate copolymer resin (EVA) and the like; a cover glass (strengthened glass) for protecting the cell module and the sealing material; and a cover film (back sheet).

In the present invention, each component of the solar cell, namely the solar cell unit (the back electrode, the photoelectric conversion layer and the transparent electrode), the sealing material, the cover glass and the cover film as well as various electrode covering materials can be the ones which have been conventionally proposed.

Practically, the film-forming material of the present invention is applied on the transparent electrode of the solar cell unit to form an electrode coating film. The solar cell is then produced by laminating the strengthened glass, the sealing material, the solar cell unit (electrode coating film/transparent electrode/photoelectric conversion layer/back electrode), the sealing material and the back sheet in this order.

EXAMPLES

The present invention is further described in detail hereinafter by referring to Examples which do not limit the present invention.

Abbreviations and compounds used in the following Examples are as follows.

<Monomers, Cross-Linkers>

NIKALAC MW-390: a melamine compound (hexamethoxymethylated melamine compound) from Sanwa Chemical Co., Ltd.;

CYMEL 1123: a melamine compound (methoxymethylated benzoguanamine compound) from Nihon Cytec Industries Inc.;

NIKALAC MX-270: a urea compound from Sanwa Chemical Co., Ltd.;

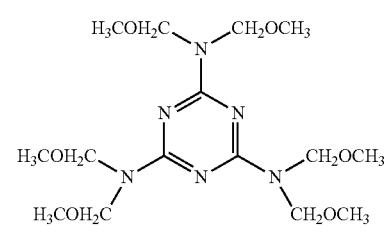

NIKALAC MW-390

-continued

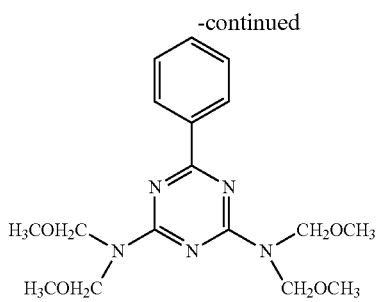
CYMEL 1123

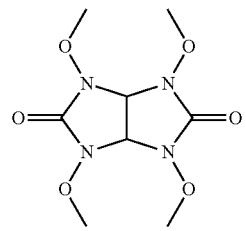
NIKALAC MX-270

9,9-bis(4-hydroxyphenyl)fluorene;
bis(4-(oxiran-2-ylmethoxy)phenyl)sulfane;

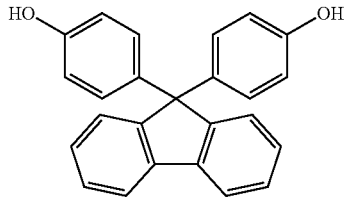
9,9-bis(4-hydroxyphenyl)fluorene

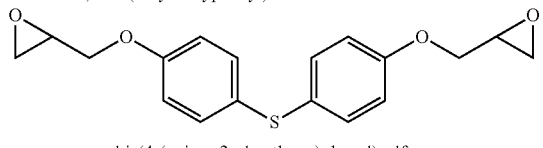
bis(4-(oxiran-2-ylmethoxy)phenyl)sulfane

VESTAGON (Registered trademark) B 1065: a blocked isocyanato compound from Evonik Degussa Japan.
<Adherence Agent>
LS-2450: 3-aminopropyldiethoxymethylsilane from Shin-Etsu Chemical Co., Ltd.
<Solvents>
PGMEA: propylene glycol monomethyl ether acetate;
PGME: propylene glycol monomethyl ether;
HBM: methyl 2-hydroxyisobutyrate;
NMP: N-methyl-2-pyrrolidone;
CHN: cyclohexanone;
EL: ethyl lactate; and
γ-BL: γ-butyrolactone.
<Surfactant>
MEGAFAC R-30: from DIC Corporation.
<Solar Cell Unit>
A 125-mm rectangular crystalline silicon cell unit from Motech Industries, Inc.
<Sealing Material>
A sealing material from Sanvic Inc.
<Tab>
A 1.5-mm PV-ribbon wire from Marusho Co., Ltd.
<Back Sheet>
A back sheet from MA Packaging Co., Ltd.
<Strengthened Glass>
A strengthened glass from Shinkyowa Co., Ltd.

[Measurement of Number Average Molecular Weight and Weight Average Molecular Weight]

Polymers obtained according to the following synthesis examples were measured for the weight average molecular weight (hereinafter abbreviated as Mw) and molecular weight distribution using a GPC instrument from JASCO Corporation (with Shodex (Registered trademark) columns KF803L and KF805L) by flowing dimethylformamide as an elution solvent in the columns (column temperature: 50° C.) at a flow rate of 1 ml/min to elute the polymers. Mw is expressed in terms of polystyrene.

[Sample Application]

Film-forming materials were applied on transparent electrodes of the cell units using a spray applicator from YD Mechatro Solutions Inc.

[Measurement of Index of Refraction]

The index of refraction was measured with a high speed spectroscopic ellipsometer M-2000 from J. A. Woollam JAPAN Co., Inc.

[Preparation of Module]

A module was prepared using a laminator LM-50×50-S from NPC Incorporated. On the strengthened glass, the sealing material, the cell unit, the sealing material and the back sheet were mounted in this order and laminated at 130° C. for 20 minutes.

[IV Measurement]

For IV measurement, a solar simulator YSS-150 from Yamashita Denso Corporation was used. The module was irradiated with light for 6 times at 25° C. and the measured IV Batas were averaged.

SYNTHESIS EXAMPLES

Synthesis of Polymer A1 (Synthesis of Polymer Compound Having a Triazine Skeleton)

To a three-neck flask equipped with a condenser after nitrogen substitution, 10.4 g (0.027 moles) of NIKALAC MW-390 and 9.64 g (0.027 moles) of CYMEL 1123 were added in 80 ml of dissolved PGMEA under nitrogen flow, followed by addition of 0.05 g (0.0003 moles) of p-toluenesulfonic acid. The mixture was stirred under heating at 150° C. and the reaction was terminated after 24 hours. The resulting polymer had a molecular weight of 12,000. The resulting solution was heated at 200° C. and the residue was used for calculation of solid matters, which gave a result of 19.56 wt %.

Synthesis of Polymer A2 (Synthesis of Polymer Compound Having a Fluorene Skeleton)

To a three-neck flask equipped with a condenser after nitrogen substitution, 10.3 g (0.029 moles) of 9,9-bis(4-hydroxyphenyl)fluorene and 9.68 g (0.029 moles) of bis(4-(oxiran-2-ylmethyl)phenyl)sulfane were added in 80 ml of dissolved PGME under nitrogen flow, followed by addition of 0.05 g (0.0003 moles) of benzyltrimethylammonium chloride. The mixture was stirred under heating at 120° C. and the reaction was terminated after 24 hours. The resulting polymer had a weight average molecular weight Mw of 6,000. It was heated at 200° C. and the residue was used for calculation of solid matters, which gave a result of 19.99 wt %.

Preparation of Film-Forming Materials: Examples 1 to 4

According to the compositions shown in the following Table 2, the component (A): polymer solution, the component (B) or (C): cross-linker, the component (D): adherence agent, the component (E): solvent and a surfactant were mixed according to Table 1 and stirred at a room temperature (approximately 25° C.) for over 3 hours to obtain a homogeneous solution so that a film-forming material in the form of varnish was obtained.

TABLE 1

Composition of film-forming materials

|  | Component (A) (g) | Component (B) (g) | Component (C) (g) | Component (D) (g) | Solvent (E) (g) | Surfactant (g) |
|---|---|---|---|---|---|---|
| Example 1 | A1 100.0 | — | — | — | PGMEA/EL 88.2/7.4 | R-30 0.0002 |
| Example 2 | A1 100.0 | MW-390 2.934 | — | LS-2450 0.002 | PGME/EL 101/20.5 | R-30 0.0002 |
| Example 3 | A1 100.0 | MX-270 5.868 | — | — | EL/γ-BL 114/33.8 | R-30 0.0002 |
| Example 4 | A2 100.0 | — | VESTAGON 3.00 | — | CHN 126 | R-30 0.0002 |

Examples 5 to 10 and Comparative Example: Preparation of Modules and IV Property Evaluation The obtained film-forming materials in the form of varnish of Examples 1 to 4 were applied on cell units using the spray device and cured prior to the formation of modules. As Comparative Example, a module was prepared in the similar manner except that the film-forming material was not applied. The film-forming materials used, the curing conditions and measured film thickness and index of refraction are shown in Table 2.

The film thickness was measured on a sample obtained after application and curing under the same conditions as described above for the cell units on a Si substrate using a contact-type film thickness analyzer (Dektak 3).

The index of refraction was measured at 633 nm on a sample obtained after application and curing under the same conditions as described above for the cell units on a Si substrate.

The current-voltage (I-V) measurement was conducted using the prepared cell units of Examples and Comparative Example. For each of the obtained short-circuit current (A): Isc, open voltage (V): Voc and maximum power output (W): Pmax, when the measured value for the cell unit of Comparative Example (without film-forming material) was considered as 100%, the relative values (%) of Isc, Voc and Pmax for the cell units of each Example were determined (see the following equations). The obtained results are shown in Table 2.

$Isc$ (%)=100×Example $X$ ($Isc$ value)/Comparative Example ($Isc$ value)

$Voc$ (%)=100×Example $X$ ($Voc$ value)/Comparative Example ($Voc$ value)

$P$max (%)=100×Example $X$ ($P$max value)/Comparative Example ($P$max value)

TABLE 2

Results of element property evaluation

| | Film-forming material | Curing conditions | Film thickness (μm) | Index of refraction | Isc (%) | Voc (%) | Pmax (%) |
|---|---|---|---|---|---|---|---|
| Example 5 | Example 1 | 180° C./10 min. | 1.0 | 1.64 | 100 | 100 | 101 |
| Example 6 | Example 2 | 180° C./10 min. | 0.5 | 1.62 | 100 | 100 | 103 |
| Example 7 | Example 2 | 180° C./30 min. | 1.0 | 1.63 | 100 | 100 | 102 |
| Example 8 | Example 2 | 230° C./30 min. | 1.0 | 1.64 | 100 | 100 | 101 |
| Example 9 | Example 3 | 180° C./10 min. | 1.0 | 1.64 | 100 | 100 | 101 |
| Example 10 | Example 4 | 180° C./10 min. | 1.0 | 1.64 | 100 | 100 | 102 |
| Comparative Example | — | — | — | — | 100 | 100 | 100 |

[Evaluation Results]

As shown in Table 2, it is apparent from the results of Examples 5 to 10 that the film-forming materials of the present invention allow increase in the maximum power output (Pmax) by 1 to 3%.

The invention claimed is:

1. A film-forming material for forming a light-collecting film on a transparent electrode of a solar cell, the film-forming material comprising:
   (I) an aromatic group-containing organic polymer compound (A) that is a compound having a fluorene skeleton, having an aromatic cardo structure and a structure of the formula (1), and having a weight average molecular weight of at least 5,000, aromatic cardo structures being linked through a structure containing an ether bond and a thioether bond:

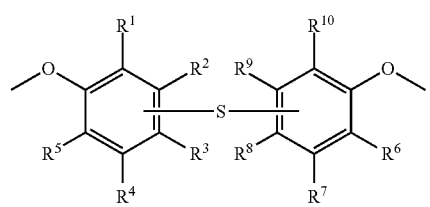

(1)

where $R^1$ to $R^{10}$ are independently a hydrogen atom, a $C_{1-10}$ alkyl group, a $C_{1-10}$ haloalkyl group, a $C_{1-10}$ alkoxy group, a halogen atom, a nitro group, a formyl group, a cyano group, an amino group, a carboxyl group, a phosphonyl group, a sulfonyl group, a phenyl group which is optionally substituted with $W^8$, a naphthyl group which is optionally substituted with $W^8$, a thienyl group which is optionally substituted with $W^8$ or a furyl group which is optionally substituted with $W^8$, provided that one group of $R^1$ to $R^5$ forms the —S— group together with one group of $R^6$ to $R^{10}$; and $W^8$ is a $C_{1-10}$ alkyl group, a $C_{1-10}$ haloalkyl group, a $C_{1-10}$ alkoxy group, a hydroxy group, a halogen atom, a nitro group, a formyl group, a cyano group, a carboxyl group, a phosphonyl group or a sulfonyl group, wherein the aromatic group-containing organic polymer (A) is a compound obtained by carrying out condensation reaction of at least one compound having an aromatic cardo structure and at least one compound having the structure of the above formula (1), wherein the compound having a structure of the formula (1) is selected from the group consisting of:

bis(4-(oxiran)-2-ylmethoxy)phenyl)sulfane,
bis(2-butyl-6-methyl-4-(oxiran)-2-ylmethoxy)phenyl) sulfane,
bis(2-isobutyl-6-methyl-4-(oxiran)-2-ylmethoxy)phenyl) sulfane,
bis(2-t-butyl-6-methyl-4-(oxiran)-2-ylmethoxy)phenyl) sulfane,
bis(2-butyl-5-methyl-4-(oxiran)-2-ylmethoxy)phenyl) sulfane,
bis(2-isobutyl-5-methyl-4-(oxiran)-2-ylmethoxy)phenyl) sulfane,
bis(2-t-butyl-5-methyl-4-(oxiran)-2-ylmethoxy)phenyl) sulfane,
bis(2-methyl-4-(oxiran)-2-ylmethoxy)phenyl)sulfane,
bis(2-ethyl-4-(oxiran)-2-ylmethoxy)phenyl)sulfane,
(2-propyl-4-(oxiran)-2-ylmethoxy)phenyl)sulfane,
(2-isopropyl-4-(oxiran)-2-ylmethoxy)phenyl)sulfane,
(2-butyl-4-(oxiran)-2-ylmethoxy)phenyl)sulfane,
(2-isobutyl-4-(oxiran)-2-ylmethoxy)phenyl)sulfane,
(2-t-butyl-4-(oxiran)-2-ylmethoxy)phenyl)sulfane,
bis(2-butyl-6-methyl-3-(oxiran)-2-ylmethoxy)phenyl) sulfane,
bis(2-isobutyl-6-methyl-3-(oxiran)-2-ylmethoxy)phenyl) sulfane,
bis(2-t-butyl-6-methyl-3-(oxiran)-2-ylmethoxy)phenyl) sulfane,
bis(2-butyl-5-methyl-3-(oxiran)-2-ylmethoxy)phenyl) sulfane,
bis(2-isobutyl-5-methyl-3-(oxiran)-2-ylmethoxy)phenyl) sulfane,
bis(2-t-butyl-5-methyl-3-(oxiran)-2-ylmethoxy)phenyl) sulfane,
bis(2-methyl-3-(oxiran)-2-ylmethoxy)phenyl)sulfane,
bis(2-ethyl-3-(oxiran)-2-ylmethoxy)phenyl)sulfane,
(2-propyl-3-(oxiran)-2-ylmethoxy)phenyl)sulfane,
(2-isopropyl-3-(oxiran)-2-ylmethoxy)phenyl)sulfane,
(2-butyl-3-(oxiran)-2-ylmethoxy)phenyl)sulfane,
(2-isobutyl-3-(oxiran)-2-ylmethoxy)phenyl)sulfane,
(2-t-butyl-3-(oxiran)-2-ylmethoxy)phenyl)sulfane, and
bis(4-(oxirane-2-ylmethoxy)-2,3-diamyl-phenyl)sulfane; and (II) as a component (C) a compound substituted with a blocked isocyanate group;

wherein the film-forming material exhibits an index of refraction of 1.5 to 2.0 at a wavelength of 633 nm and a transmittance of 95% or more with respect to light having a wavelength of 400 nm.

2. The film-forming material according to claim 1, wherein the organic polymer compound (A) is a compound having at least four benzene rings.

3. The film-forming material according to claim 1, wherein the film-forming material contains the component (C) at 10 to 100 parts by mass relative to 100 parts by mass of the organic polymer compound (A).

4. The film-forming material according to claim 1, wherein the film-forming material further contains a solvent (E) and is in a form of varnish.

5. A solar cell obtained by coating a cured film made from the film-forming material according to claim 1 on a surface of a transparent electrode.

\* \* \* \* \*